(12) United States Patent
Cen et al.

(10) Patent No.: US 12,191,200 B2
(45) Date of Patent: Jan. 7, 2025

(54) METHODS FOR MINIMIZING FEATURE-TO-FEATURE GAP FILL HEIGHT VARIATIONS

(71) Applicant: Applied Materials, Inc., Santa Clara, CA (US)

(72) Inventors: Jiajie Cen, Mountain View, CA (US); Da He, Sunnyvale, CA (US); Yi Xu, San Jose, CA (US); Yu Lei, Belmont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 611 days.

(21) Appl. No.: 17/489,089

(22) Filed: Sep. 29, 2021

(65) Prior Publication Data
US 2023/0098561 A1 Mar. 30, 2023

(51) Int. Cl.
*H01L 21/768* (2006.01)
*H01L 21/02* (2006.01)

(52) U.S. Cl.
CPC .. *H01L 21/76879* (2013.01); *H01L 21/02063* (2013.01); *H01L 21/76814* (2013.01); *H01L 21/76876* (2013.01)

(58) Field of Classification Search
None
See application file for complete search history.

(56) References Cited

U.S. PATENT DOCUMENTS

| | | |
|---|---|---|
| 4,517,225 A | 5/1985 | Broadbent |
| 7,514,353 B2 | 4/2009 | Weidman et al. |
| 9,412,608 B2 | 8/2016 | Wang et al. |
| 2006/0009034 A1 | 1/2006 | Lai et al. |
| 2016/0126104 A1 | 5/2016 | Shaviv et al. |
| 2017/0148670 A1* | 5/2017 | Lei ............ H01L 21/31116 |
| 2019/0214296 A1 | 7/2019 | Wang et al. |
| 2020/0111675 A1 | 4/2020 | Takatsuki et al. |
| 2020/0227275 A1 | 7/2020 | Mullick et al. |
| 2020/0335395 A1 | 10/2020 | Xu et al. |

OTHER PUBLICATIONS

International Search Report for PCT/US2022/036101, dated Oct. 25, 2022.

* cited by examiner

*Primary Examiner* — Asok K Sarkar
(74) *Attorney, Agent, or Firm* — Moser Taboa

(57) ABSTRACT

A method of gap filling a feature on a substrate decreases the feature-to-feature gap fill height variation by using a tungsten halide soak treatment. In some embodiments, the method may include heating a substrate to a temperature of approximately 350 degrees Celsius to approximately 450 degrees Celsius, exposing the substrate to a tungsten halide gas at a process pressure of approximately 5 Torr to approximately 25 Torr, soaking the substrate for a soak time of approximately 5 seconds to approximately 60 seconds with the tungsten halide gas, and performing a metal preclean process and a gap fill deposition on a plurality of features on the substrate after soaking of the substrate has completed.

20 Claims, 4 Drawing Sheets

METHODS FOR MINIMIZING FEATURE-TO-FEATURE GAP FILL HEIGHT VARIATIONS

FIELD

Embodiments of the present principles generally relate to semiconductor processing of semiconductor substrates.

BACKGROUND

During deposition of gap fill material in features such as vias and trenches, not all of the features reach the same gap fill height. Contaminants on the surfaces of the seed layers in the bottom of the features along with contaminants on the sidewalls of the features often cause irregular filling of the feature. Some features may have low fill heights, others may have inclined fill top surfaces, and yet others may have irregular fill top surfaces. All such defects cause large feature-to-feature gap fill height variations which lead to problematic processing during subsequent workflows and often lead to low performance of the features such as high contact resistances.

Accordingly, the inventors have provided improved processes that minimizes feature-to-feature variations with high throughput and increased feature performance.

SUMMARY

Methods and apparatus for minimizing feature-to-feature gap fill height variations for gap filling of features are provided herein.

In some embodiments, a method of gap filling a feature on a substrate may comprise heating a substrate to a temperature of approximately 350 degrees Celsius to approximately 450 degrees Celsius, exposing the substrate to a tungsten halide gas at a process pressure of approximately 5 Torr to approximately 25 Torr, soaking the substrate for a soak time of approximately 5 seconds to approximately 60 seconds with the tungsten halide gas, and performing a metal preclean process and a gap fill deposition on a plurality of features on the substrate after soak time has elapsed.

In some embodiments, the method may further include wherein the tungsten halide gas is tungsten hexafluoride gas ($WF_6$), tungsten pentachloride gas ($WCl_5$), or tungsten hexachloride gas ($WCl_6$), flowing the tungsten halide gas at a flow rate of approximately 400 sccm, exposing the substrate to a gas mixture of the tungsten halide gas and a hydrogen gas, wherein the hydrogen gas has a flow rate of greater than zero to approximately 6000 sccm, wherein the tungsten halide gas has a flow rate of 400 sccm, the hydrogen gas has a flow rate of approximately 400 sccm to approximately 3000 sccm, the soak time is approximately 10 seconds, the process pressure is 10 Torr, and the temperature is approximately 350 degrees Celsius, wherein the hydrogen gas has a flow rate of approximately 3000 sccm, wherein the tungsten halide gas has a flow rate of 400 sccm, the soak time is approximately 10 seconds, the process pressure is 10 Torr, and the temperature is approximately 400 degrees Celsius, wherein a feature-to-feature gap fill height of the plurality of features on the substrate has a variation of less than 9 nm, and/or performing an oxygen treatment on the substrate prior to soaking the substrate.

In some embodiments, a method of gap filling a feature on a substrate may comprise heating a substrate to a temperature of approximately 350 degrees Celsius to approximately 450 degrees Celsius, exposing the substrate to a tungsten hexafluoride gas ($WF_6$) at a process pressure of approximately 10 Torr, soaking the substrate for a soak time of approximately 10 seconds with the tungsten hexafluoride gas, and performing a metal preclean process and a gap fill deposition on a plurality of features on the substrate after soak time has elapsed.

In some embodiments, the method may further comprise flowing the tungsten hexafluoride gas ($WF_6$) at a flow rate of approximately 400 sccm, exposing the substrate to a gas mixture of the tungsten hexafluoride gas ($WF_6$) and a hydrogen gas, wherein the hydrogen gas has a flow rate of greater than zero to approximately 6000 sccm, wherein the tungsten hexafluoride gas ($WF_6$) has a flow rate of 400 sccm, the hydrogen gas has a flow rate of approximately 400 sccm to approximately 3000 sccm, and the temperature is approximately 350 degrees Celsius, wherein the hydrogen gas has a flow rate of approximately 3000 sccm, wherein the tungsten hexafluoride gas ($WF_6$) has a flow rate of 400 sccm, and the temperature is approximately 400 degrees Celsius, and/or wherein a feature-to-feature gap fill height of the plurality of features on the substrate has a variation of less than 9 nm.

In some embodiments, a non-transitory, computer readable medium having instructions stored thereon that, when executed, cause a method of gap filling a feature to be performed, the method may comprise heating a substrate to a temperature of approximately 350 degrees Celsius to approximately 450 degrees Celsius, exposing the substrate to a tungsten halide gas at a process pressure of approximately 5 Torr to approximately 25 Torr, soaking the substrate for a soak time of approximately 5 seconds to approximately 60 seconds with the tungsten halide gas, and performing a metal preclean process and a gap fill deposition on a plurality of features on the substrate after soak time has elapsed, wherein a feature-to-feature gap fill height variation of the plurality of features on the substrate is less than 9 nm.

In some embodiments, the method of the non-transitory, computer readable medium may further comprise exposing the substrate to a gas mixture of the tungsten halide gas and a hydrogen gas, wherein the tungsten halide gas has a flow rate of 400 sccm and the hydrogen gas has a flow rate of greater than zero to approximately 6000 sccm, exposing the substrate to a gas mixture of the tungsten halide gas and a hydrogen gas, the hydrogen gas has a flow rate of approximately 400 sccm to approximately 3000 sccm, the soak time is approximately 10 seconds, the process pressure is 10 Torr, and the temperature is approximately 350 degrees Celsius, and/or exposing the substrate to a gas mixture of the tungsten halide gas and a hydrogen gas, wherein the tungsten halide gas has a flow rate of 400 sccm, the soak time is approximately 10 seconds, the process pressure is 10 Torr, and the temperature is approximately 400 degrees Celsius.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
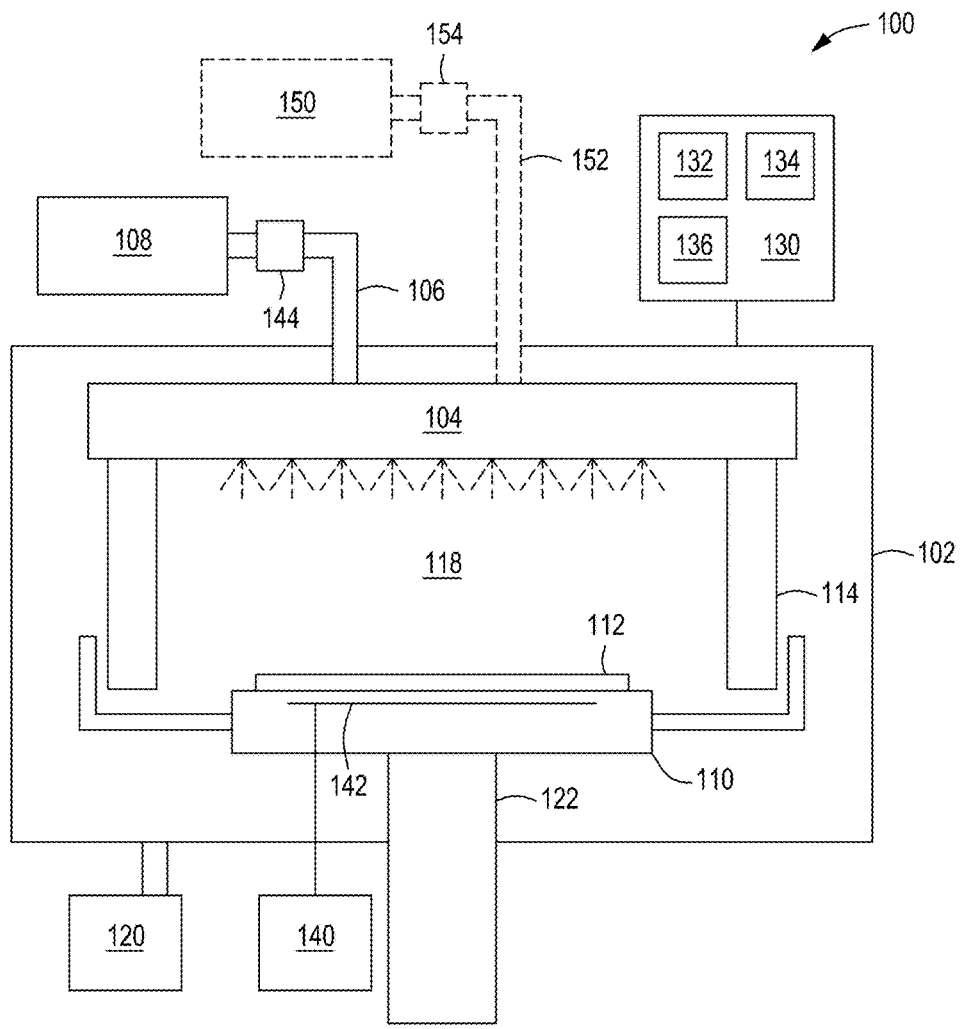
FIG. 1 depicts a cross-sectional view of a process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide an additional process that is compatible with current approaches to further suppress selectivity loss and mitigate feature-to-feature gap fill height variations while also satisfying thermal budgets. The enhanced processes have at least a one-order-magnitude reduction of feature-to-feature gap fill height variation over the 10-20 nm variations of traditional processes. The methods of the present principles can produce feature-to-feature gap fill height variations of only a few nanometers or less. The techniques also result in significant improvements in suppressing field selectivity loss and provide wide process window tuning of parameters including gas combinations, pressure, temperature, and duration while guaranteeing comparable process performance.

Even though traditional approaches for gap fill have been used extensively in the semiconductor industry, large feature-to-feature gap fill height discrepancies still lead to poor performance and high contact resistance, Rc, of features such as vias and trenches, resulting in low yields. The traditional approach of metal preclean and deposition cannot remove etch residues on feature aspects such as via or trench sidewalls, resulting in long incubation, selectivity loss, and, thus, high feature-to-feature gap fill height variation. The methods of the present principles utilize an optional oxygen plasma clean and a tungsten halide (e.g., $WF_6$, $WCl_6$, $WCl_6$, etc.) soak prior to traditional metal preclean processes. The methods may be performed at temperatures ranging from approximately 350 degrees Celsius to approximately 450 degrees Celsius, preserving thermal budgets. To further reduce process temperatures while maintaining performance, hydrogen gas may be introduced along with the tungsten halide.

The methods disclosed herein may be used in any chamber that provides gases for soaking along with temperature and pressure control. In some embodiments that incorporate oxygen-based treatments, an additional chamber may be used to apply the treatment (see, e.g., integrated tool of FIG. 6) to the substrate prior to soaking the substrate in tungsten halide and the like. FIG. 1 depicts a view 100 of a process chamber 102 in accordance with some embodiments. The process chamber 102 includes a substrate support 122 that holds an electrostatic chuck (ESC) 110 and a shield 114 that surrounds a processing volume 118. A showerhead 104 provides a process gas or gases into the processing volume 118 via a gas supply conduit 106 from a gas supply 108. The process gas flow rate is controlled by a gas flow valve 144. In some embodiments, the process gas may be supplied at a flow rate of approximately 400 sccm. In some embodiments, an optional gas supply conduit 152 may supply an optional process gas from an optional gas supply 150. The optional process gas flow rate is controlled by a second gas flow valve 154. In some embodiments, the optional process gas may be supplied at a flow rate of greater than zero to approximately 6000 sccm. Contaminants or unwanted gases are removed from the process chamber 102 by a pump 120. The pump 120 may also be used to maintain the process pressure within the process chamber 102. In some embodiments, the process pressure may be from approximately 5 Torr to approximately 25 Torr. The process chamber 102 may also have thermal control elements or channels 142 that allow temperature control of the substrate 112 during processing by a temperature controller 140. In some embodiments, the process temperature may be approximately 350 degrees Celsius to approximately 450 degrees Celsius.

A controller 130 controls the operation of the process chamber 102 using a direct control of the process chamber 102 or alternatively, by controlling the computers (or controllers) associated with the process chamber 102. In operation, the controller 130 enables data collection and feedback from the respective systems to optimize performance of the process chamber 102. The controller 130 generally includes a Central Processing Unit (CPU) 132, a memory 134, and a support circuit 136. The CPU 132 may be any form of a general-purpose computer processor that can be used in an industrial setting. The support circuit 136 is conventionally coupled to the CPU 132 and may comprise a cache, clock circuits, input/output subsystems, power supplies, and the like. Software routines, such as a method as described herein may be stored in the memory 134 and, when executed by the CPU 132, transform the CPU 132 into a specific purpose computer (controller 130). The software routines may also be stored and/or executed by a second controller (not shown) that is located remotely from the process chamber 102. In some embodiments, the use of plasma may be included to facilitate in exposing the substrate to an oxygen rich environment during an optional oxygen-based treatment. The optional oxygen-based treatment may also assist in higher rate gap filling and affords another knob for tuning feature-to-feature gap fill height variations along with temperature, pressure, flow rates, and gas combinations.

The memory 134 is in the form of computer-readable storage media that contains instructions, when executed by the CPU 132, to facilitate the operation of the semiconductor processes and equipment. The instructions in the memory 134 are in the form of a program product such as a program that implements the methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 2:
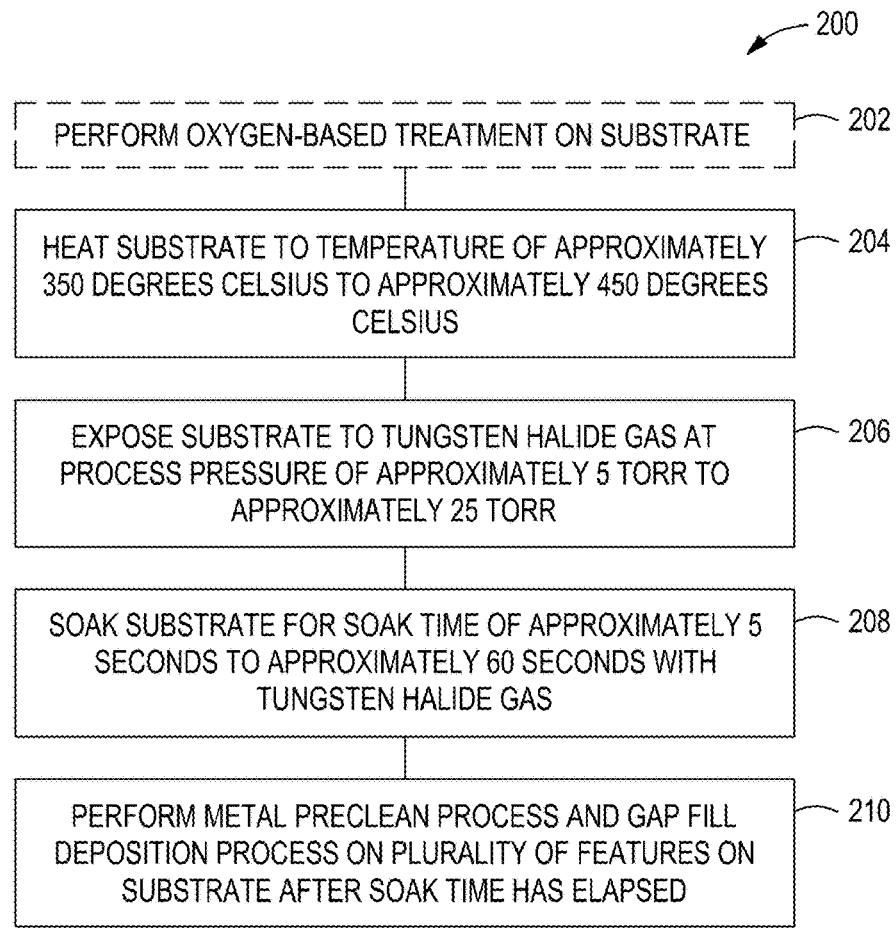
FIG. 2 is a method of gap filling a feature on a substrate in accordance with some embodiments of the present principles.
Figure 3:
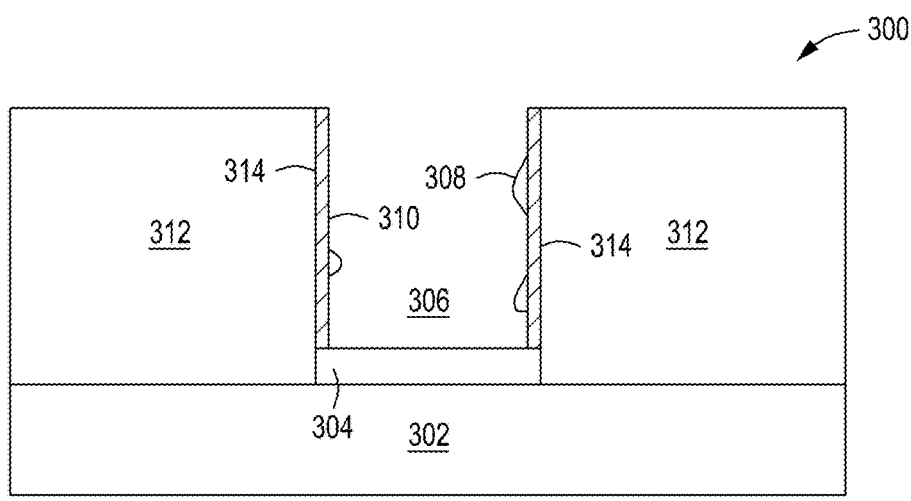
FIG. 3 depicts a cross-sectional view of a via on a substrate before treatment in accordance with some embodiments of the present principles.

FIG. 2 is a method 200 of gap filling a feature on a substrate in accordance with some embodiments. In block 202, an optional oxygen-based treatment may be performed on the substrate. The optional oxygen-based treatment may be used when contaminant tungsten material is to be removed prior to subsequent soaking of the substrate. FIG. 3 depicts a view 300 of a via 306 formed in a dielectric layer 312 on a substrate 302 before any treatment in accordance with some embodiments. The via 306 is used as an example feature and is not meant to be limiting as the methods disclosed herein may also be used for other features such as trenches and the like. The via 306 has sidewalls 314 and a seed layer 304 of tungsten material at the bottom. After etching of the via 306, remnants 310 such as dangling bonds and other etch residues may remain on the sidewalls 314. Particles 308 such as tungsten trioxide etch residues may also be found on the sidewalls 314. In some cases, the particles 308 may be tungsten material which is removed by performing the optional oxygen-based treatment of block 202. The optional oxygen-based treatment exposes the substrate 302 to an oxygen rich environment which can include formation of oxygen variants by plasma and other means to produce oxygen ions from oxygen gas ($O_2$) or ozone ($O_3$) and the like that interact with the tungsten material to transform the tungsten material into tungsten oxides which can then be removed by the tungsten halide soak treatment.

In block 204, the substrate 302 is heated to a temperature of approximately 350 degrees Celsius to approximately 450 degrees Celsius. Temperatures may be adjusted based on an allowable thermal budget of other structures found on the substrate 302 that is being processed. Higher temperatures yield better results in reducing the feature-to-feature gap fill height variations. In block 206, the substrate is exposed to a tungsten halide gas at a process pressure of approximately 5 Torr to approximately 25 Torr. In some embodiments, the tungsten halide gas may be $WF_6$, $WCl_5$, or $WCl_6$ and the like with a flow rate of approximately 400 sccm. In some embodiments an optional process gas such as hydrogen gas may be flowed at a flow rate of greater than zero to approximately 6000 sccm along with the tungsten halide gas to facilitate in lower temperature soaking of the substrate. In some embodiments, the process pressure may be approximately 10 Torr. In block 208, the substrate 302 is soaked for a soak time of approximately 5 seconds to approximately 60 seconds with the tungsten halide gas or with tungsten halide gas and an optional process gas such as hydrogen gas. In some embodiments, the soak time is approximately 5 seconds to approximately 30 seconds. In some embodiments, the soak time is approximately 10 seconds.

Figure 4:
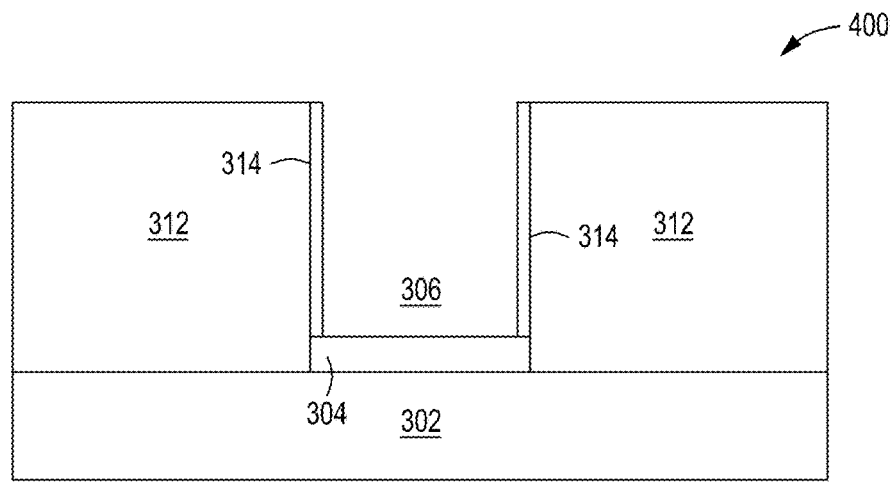
FIG. 4 depicts a cross-sectional view of a via on a substrate after treatment in accordance with some embodiments of the present principles.

FIG. 4 depicts a view 400 of the via 306 on the substrate 302 after treatment in accordance with some embodiments. The remnants 310 including dangling bonds or other etch residues have been eliminated along with the particles 308 such as tungsten trioxide etch residues and the like. The remnants 310 and the particles 308 cause gap fill and selectivity issues which are now no longer problematic, ensuring high quality gap fills and decreased feature-to-feature gap fill height variations. In some embodiments, the feature-to-feature gap fill height variation is less than 9 nm. In some embodiments, the feature-to-feature gap fill height variation is less than approximately 8 nm. In some embodiments, the feature-to-feature gap fill height variation is less than approximately 2 nm. Smaller feature-to-feature gap fill height variation allows for better gap fill and control of the height to ensure full gap fill to the uppermost surface of the substrate. Higher gap fill height also reduces the amount of material used to correct for low gap fill heights which causes increased contact resistance of the features. Low variations have the benefit of tighter gap fill height control and increased performance and low contact resistances. In the same light, low variations also help during subsequent chemical mechanical polishing processes due to less overburden.

In some embodiments, the substrate is soaked for approximately 10 seconds with a $WF_6$ flow rate of approximately 400 sccm and a hydrogen gas flow rate of zero to approximately 6000 sccm at a temperature of approximately 350 degrees Celsius to approximately 450 degrees Celsius and a process pressure of approximately 5 Torr to approximately 25 Torr. In some embodiments, the substrate is soaked for approximately 10 seconds with a $WF_6$ flow rate of approximately 400 sccm and a hydrogen gas flow rate of approximately 400 sccm to approximately 3000 sccm at a temperature of approximately 350 degrees Celsius and a process pressure of approximately 10 Torr. In some embodiments, the substrate is soaked for approximately 10 seconds with an approximately 400 sccm flow rate of $WF_6$ at a temperature of approximately 400 degrees Celsius and a process pressure of approximately 10 Torr. In some embodiments, the substrate is soaked for approximately 10 seconds with an approximately 400 sccm flow rate of $WF_6$ and an approximately 3000 sccm flow rate of hydrogen gas at a temperature of approximately 350 degrees Celsius and a process pressure of approximately 10 Torr.

Figure 5:
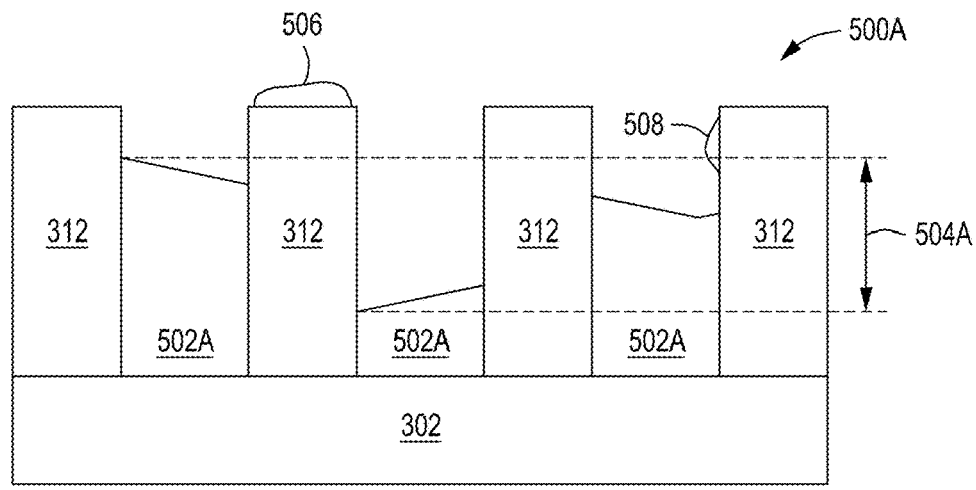
FIG. 5 depicts cross-sectional views of feature-to-feature gap fill height variations without and with treatment in accordance with some embodiments of the present principles.
Figure 5:
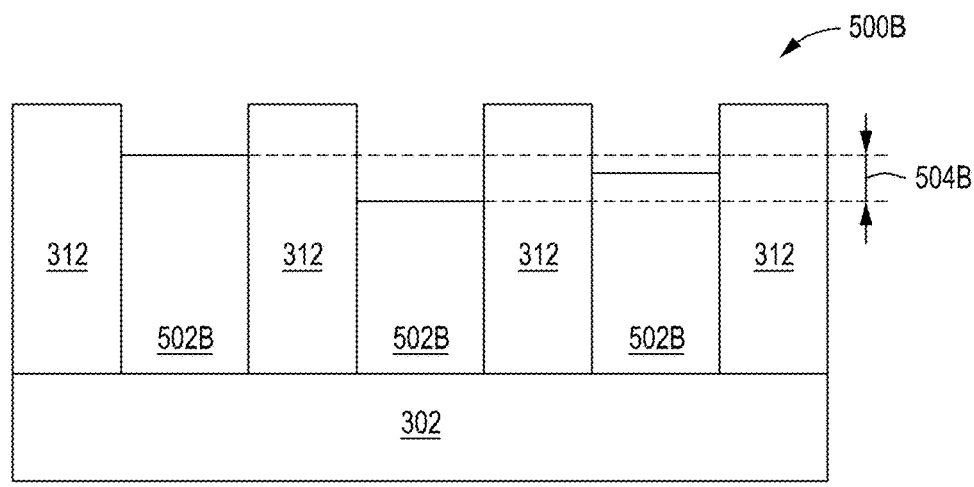

In block 210, a metal preclean process and a gap fill deposition process is performed on a plurality of features after the soak time has elapsed. The metal preclean process facilitates in removing any contaminants from the seed layers such as oxides and the like to allow growth on the seed layers. The gap fill deposition process is performed, resulting in a significantly reduced feature-to-feature gap fill height variation of the features on the substrate. FIG. 5 depicts views of feature-to-feature gap fill height variations without and with treatment in accordance with some embodiments. In view 500A, the substrate 302 is untreated by the present methods. After gap fill, the features 502A are left with various gap fill heights and the surfaces are irregular. The untreated gap fill height variation 504A is large and difficult to determine accurately due to the irregular top surfaces of the gap fill material. In addition, selectivity of the tungsten deposition material over the dielectric material has been reduced, leaving tungsten field deposits 506 and tungsten sidewall deposits 508 which greatly reduce the performance of the feature, even resulting in defects that lead to reduced yields. In view 500B, the substrate 302 has undergone treatment according to the present methods. After gap fill, the features 502B have very similar gap fill heights and more uniform surfaces than untreated features. The treated gap fill height variation 504B is significantly smaller than the untreated gap fill height variation 504A. In addition, selectivity of the tungsten deposition material over the dielectric material has been improved as no tungsten field deposits or tungsten sidewall deposits are present which greatly increases the performance of the features and increasing yields by reducing defects. The present methods also have the benefit of integrating into existing workflows without greatly impacting throughput due to use of common process chambers and short processing time.

Figure 6:
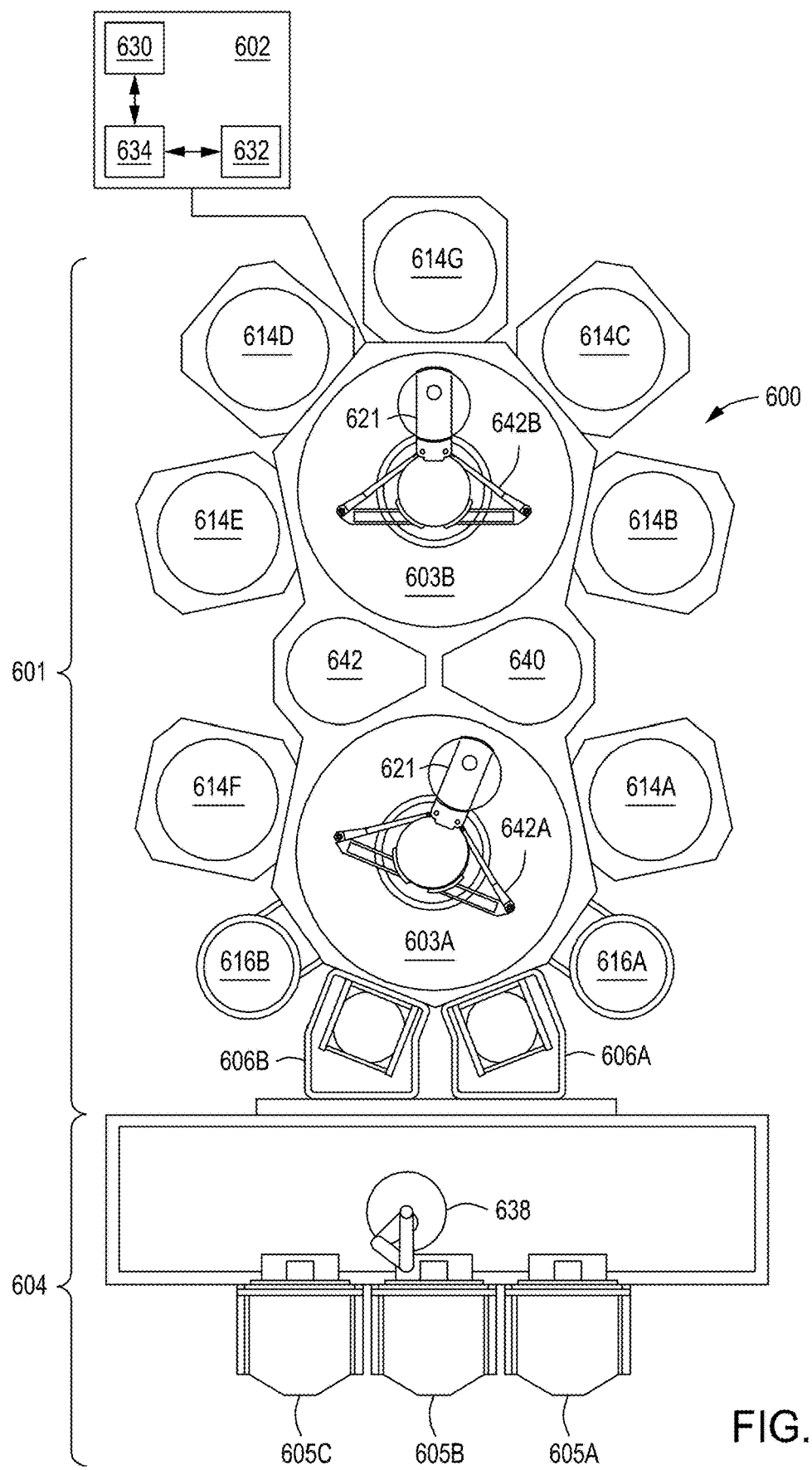
FIG. 6 depicts a top view of an integrated tool in accordance with some embodiments of the present principles.

FIG. 6 depicts a view of an integrated tool 600 in accordance with some embodiments. The integrated tool 600 allows for the optional oxygen-based treatment, the tungsten halide soak treatment, metal preclean, and the gap fill deposition processes to be completed in a single tool. Accordingly, the methods described herein may be performed in individual process chambers that may be provided in a standalone configuration or as part of a cluster tool, for example, an integrated tool 600 (i.e., cluster tool) described below with respect to FIG. 6. The advantage of using an integrated tool 600 is that there is no vacuum break. However, the methods described herein may be practiced using other cluster tools having suitable process chambers, or in other suitable independent process chambers. The integrated tool 600 includes a vacuum-tight processing platform 601, a factory interface 604, and a system controller 602. The processing platform 601 comprises multiple processing chambers, such as 614A, 614B, 614C, 614D, 614E, 614F, and 614G operatively coupled to a vacuum substrate transfer chamber (transfer chambers 603A, 603B). The factory interface 604 is operatively coupled to the transfer chamber 603A by one or more load lock chambers (two load lock chambers, such as 606A and 606B shown in FIG. 6).

In some embodiments, the factory interface 604 comprises at least one docking station 607, at least one factory interface robot 638 to facilitate the transfer of the semiconductor substrates. The docking station 607 is configured to accept one or more front opening unified pod (FOUP). Three FOUPS, such as 605A, 605B, and 605C are shown in the embodiment of FIG. 6. The factory interface robot 638 is configured to transfer the substrates from the factory interface 604 to the processing platform 601 through the load lock chambers, such as 606A and 606B. Each of the load lock chambers 606A and 606B have a first port coupled to the factory interface 604 and a second port coupled to the transfer chamber 603A. The load lock chamber 606A and 606B are coupled to a pressure control system (not shown) which pumps down and vents the load lock chambers 606A and 606B to facilitate passing the substrates between the vacuum environment of the transfer chamber 603A and the substantially ambient (e.g., atmospheric) environment of the factory interface 604. The transfer chambers 603A, 603B have vacuum robots 642A, 642B disposed in the respective transfer chambers 603A, 603B. The vacuum robot 642A is capable of transferring substrates 621 between the load lock chamber 606A, 606B, the processing chambers 614A and 614F and a cooldown station 640 or a pre-clean station 642. The vacuum robot 642B is capable of transferring substrates 621 between the cooldown station 640 or pre-clean station 642 and the processing chambers 614B, 614C, 614D, 614E, and 614G.

In some embodiments, the processing chambers 614A, 614B, 614C, 614D, 614E, 614F, and 614G are coupled to the transfer chambers 603A, 603B. The processing chambers 614A, 614B, 614C, 614D, 614E, 614F, and 614G comprise at least an atomic layer deposition (ALD) process chamber and a chemical vapor deposition (CVD) process chamber. Additional chambers may also be provided such as physical vapor deposition (PVD) chambers, annealing chambers, additional ALD chambers, additional PVD chambers, optional oxygen-based treatment chambers, or the like. ALD and CVD chambers may include any chambers suitable to perform all or portions of the methods described herein, as discussed above. In some embodiments, one or more optional service chambers (shown as 616A and 616B) may be coupled to the transfer chamber 603A. The service chambers 616A and 616B may be configured to perform other substrate processes, such as degassing, orientation, substrate metrology, cool down, and the like.

The system controller 602 controls the operation of the tool 600 using a direct control of the process chambers 614A, 614B, 614C, 614D, 614E, 614F, and 614G or alternatively, by controlling the computers (or controllers) associated with the process chambers 614A, 614B, 614C, 614D, 614E, 614F, and 614G and the tool 600. In operation, the system controller 602 enables data collection and feedback from the respective chambers and systems to optimize performance of the tool 600. The system controller 602 generally includes a Central Processing Unit (CPU) 630, a memory 634, and a support circuit 632. The CPU 630 may be any form of a general-purpose computer processor that can be used in an industrial setting. The support circuit 632 is conventionally coupled to the CPU 630 and may comprise a cache, clock circuits, input/output subsystems, power supplies, and the like. Software routines, such as a method as described above may be stored in the memory 634 and, when executed by the CPU 630, transform the CPU 630 into a specific purpose computer (system controller) 602. The software routines may also be stored and/or executed by a second controller (not shown) that is located remotely from the tool 600.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of gap filling a feature on a substrate, comprising:
heating a substrate to a temperature of approximately 350 degrees Celsius to approximately 450 degrees Celsius;
exposing the substrate to a tungsten halide gas at a process pressure of approximately 5 Torr to approximately 25 Torr;
soaking the substrate for a soak time of approximately 5 seconds to approximately 60 seconds with the tungsten halide gas; and
performing a metal preclean process and a gap fill deposition on a plurality of features on the substrate after soak time has elapsed.

2. The method of claim 1, wherein the tungsten halide gas is tungsten hexafluoride gas ($WF_6$), tungsten pentachloride gas ($WCl_5$), or tungsten hexachloride gas ($WCl_6$).

3. The method of claim 1, further comprising:
flowing the tungsten halide gas at a flow rate of approximately 400 sccm.

4. The method of claim 1, further comprising:
exposing the substrate to a gas mixture of the tungsten halide gas and a hydrogen gas during soaking of the substrate.

5. The method of claim 4, wherein the hydrogen gas has a flow rate of greater than zero to approximately 6000 sccm.

6. The method of claim 5, wherein the tungsten halide gas has a flow rate of 400 sccm, the hydrogen gas has a flow rate of approximately 400 sccm to approximately 3000 sccm, the soak time is approximately 10 seconds, the process pressure is 10 Torr, and the temperature is approximately 350 degrees Celsius.

7. The method of claim 6, wherein the hydrogen gas has a flow rate of approximately 3000 sccm.

8. The method of claim 1, wherein the tungsten halide gas has a flow rate of 400 sccm, the soak time is approximately 10 seconds, the process pressure is 10 Torr, and the temperature is approximately 400 degrees Celsius.

9. The method of claim 1, wherein a feature-to-feature gap fill height of the plurality of features on the substrate has a variation of less than 9 nm.

10. The method of claim 1, further comprising:
performing an oxygen treatment to convert tungsten material into tungsten oxides on the substrate prior to soaking the substrate.

11. A method of gap filling a feature on a substrate, comprising:
heating a substrate to a temperature of approximately 350 degrees Celsius to approximately 450 degrees Celsius;
exposing the substrate to a tungsten hexafluoride gas ($WF_6$) at a process pressure of approximately 10 Torr;
soaking the substrate for a soak time of approximately 10 seconds with the tungsten hexafluoride gas; and
performing a metal preclean process and a gap fill deposition on a plurality of features on the substrate after soak time has elapsed.

12. The method of claim 11, further comprising:
flowing the tungsten hexafluoride gas ($WF_6$) at a flow rate of approximately 400 sccm.

13. The method of claim 11, further comprising:
exposing the substrate to a gas mixture of the tungsten hexafluoride gas ($WF_6$) and a hydrogen gas during soaking of the substrate.

14. The method of claim 13, wherein the hydrogen gas has a flow rate of greater than zero to approximately 6000 sccm.

15. The method of claim 14, wherein the tungsten hexafluoride gas ($WF_6$) has a flow rate of 400 sccm, the hydrogen gas has a flow rate of approximately 400 sccm to approximately 3000 sccm, and the temperature is approximately 350 degrees Celsius.

16. The method of claim 15, wherein the hydrogen gas has a flow rate of approximately 3000 sccm.

17. The method of claim 11, wherein the tungsten hexafluoride gas ($WF_6$) has a flow rate of 400 sccm, and the temperature is approximately 400 degrees Celsius.

18. The method of claim 11, wherein a feature-to-feature gap fill height of the plurality of features on the substrate has a variation of less than 9 nm.

19. A non-transitory, computer readable medium having instructions stored thereon that, when executed, cause a method of gap filling a feature to be performed, the method comprising:
heating a substrate to a temperature of approximately 350 degrees Celsius to approximately 450 degrees Celsius;
exposing the substrate to a tungsten halide gas at a process pressure of approximately 5 Torr to approximately 25 Torr;
soaking the substrate for a soak time of approximately 5 seconds to approximately 60 seconds with the tungsten halide gas; and
performing a metal preclean process and a gap fill deposition on a plurality of features on the substrate after soak time has elapsed, wherein a feature-to-feature gap fill height variation of the plurality of features on the substrate is less than 9 nm.

20. The non-transitory, computer readable medium of claim 19, the method further comprising:
exposing the substrate to a gas mixture of the tungsten halide gas and a hydrogen gas, wherein the tungsten halide gas has a flow rate of 400 sccm and the hydrogen gas has a flow rate of greater than zero to approximately 6000 sccm;
exposing the substrate to a gas mixture of the tungsten halide gas and a hydrogen gas, the hydrogen gas has a flow rate of approximately 400 sccm to approximately 3000 sccm, the soak time is approximately 10 seconds, the process pressure is 10 Torr, and the temperature is approximately 350 degrees Celsius; or
exposing the substrate to a gas mixture of the tungsten halide gas and a hydrogen gas, wherein the tungsten halide gas has a flow rate of 400 sccm, the soak time is approximately 10 seconds, the process pressure is 10 Torr, and the temperature is approximately 400 degrees Celsius.

* * * * *